United States Patent [19]

Sigilião Da Costa et al.

[11] Patent Number: 5,831,550
[45] Date of Patent: Nov. 3, 1998

[54] SYSTEM AND PROCESS FOR THE MEASUREMENT OF THE ELECTRIC ENERGY CONSUMPTION OF A PLURALITY OF CONSUMERS

[75] Inventors: Reynaldo Sigilião Da Costa; Landulfo Mosqueira Alvarenga; Roberto Pereira Caldas; Ary Vaz Pinto Junior; Julio Cesar Gomes Pimentel; Cesar Jorge Bandim; Fabio Cavaliere De Souza, all of Rio de Janeiro, Brazil

[73] Assignee: Centro de Pesquisas de Energia Eletrica - Cepel, Rio de Janeiro, Brazil

[21] Appl. No.: 841,357

[22] Filed: Apr. 23, 1997

Related U.S. Application Data

[63] Continuation of Ser. No. 343,509, Nov. 29, 1994, abandoned.

[30] Foreign Application Priority Data

Jun. 1, 1992 [BR] Brazil ..................................... 9202095

[51] Int. Cl.$^6$ .................................................. G08B 23/00
[52] U.S. Cl. ............................... 340/870.05; 340/870.02; 361/601; 361/661; 324/142
[58] Field of Search .......................... 340/870.11, 870.02, 340/870.03, 870.05; 361/601, 660, 661; 364/492; 324/96, 107, 111, 142

[56] References Cited

U.S. PATENT DOCUMENTS 4,437,059  3/1984  Hauptman ............................... 324/142

FOREIGN PATENT DOCUMENTS

| | | |
|---|---|---|
| 2392391 | 12/1978 | France . |
| 4109928 | 10/1992 | Germany . |
| 2086062 | 5/1982 | United Kingdom . |
| 2157448 | 10/1985 | United Kingdom . |
| 2183852 | 6/1987 | United Kingdom . |
| 2203920 | 10/1988 | United Kingdom . |

*Primary Examiner*—Michael Horabik
*Assistant Examiner*—Albert K. Wong
*Attorney, Agent, or Firm*—Beveridge, DeGrandi, Weilacher & Young, LLP

[57] ABSTRACT

The present invention refers to a centralized system and process for measuring, registering, reading and billing data referring to electric energy consumption of a plurality of consumers (14–17), which receive the electric energy through a plurality of respective consumer connecting cables (18–21), connected to a main electric energy inlet cable (12) which, in turn, is connected to the electric energy distributing network (11). The system object of this invention basically comprises a voltage sensor (27); a plurality of energy transducer modules (ETMs) (28–31), each one connected to a respective consumer connecting cable (18–21) and including a current sensor (34) connected to an energy transducer circuit (35) connected to said voltage sensor (27) and capable of generating, in its output, signals corresponding to the current and voltage present at the respective consumer connecting cable (18–21); and a register/concentrator module (RCM) (26) having a memory and connected to the outputs of the several energy transducer circuits (35), and being capable of processing the said signals corresponding to current and voltage for their transmission or visual exhibition. The process of the present invention basically comprises the steps of measuring the current and voltage present in each consumer connecting cable (18–21); generating signals coresponding to such current and voltage; sending the said signals to a register/concentrator module (RCM) (26) having a memory and capable of processing the said signals for their transmission or visual exhibition.

13 Claims, 8 Drawing Sheets

MEASURING UNIT CONTAINING N ETMs

SYSTEM AND PROCESS FOR THE MEASUREMENT OF THE ELECTRIC ENERGY CONSUMPTION OF A PLURALITY OF CONSUMERS

This application is a continuation of application Ser. No. 08/343,509, filed Nov. 29, 1994 now abandoned, which application is entirely incorporated herein by reference.

BACKGROUND OF THE INVENTION

The present invention refers to the centralized measurement, registering reading and billing of electric energy consumption and, more specifically, to a method and equipment to be installed preferably near residential blocks of apartments, commercial and industrial buildings and intended to measure, register and provide information regarding individual and global electric energy consumption, according to simple or complex tariffs, allowing manual, automatic and/or remote centralized reading of the consumption data, with an option being provided for the local emission of bills and/or pre-payment, and also permitting the switching of electric charges in accordance to predetermined programs and/or remote control signals.

Historically, low voltage electric energy distributors bill their clients for the consumed electricity according to consumption readings obtained from individual meters. These meters, installed near the consumers, are conventionally read in loco, and the readings thus obtained are sent to the distributing companies for processing and billing of the clients.

This method and the related equipments have been improved and modified in an attempt to obviate several associated problems and shortcomings which, in a situation of large agglomeration of consumers, such as in large apartment buildings, are even more serious.

A first aspect to be analysed, with regard to those problems and shortcomings, is the electric energy meter its self, which is utilized for the purposes of billing the consumers.

Electricity billing has been mostly carried out with the utilization of electromechanical meters, derived from a technology 100 years old. In spite of their large scale use, this type of meter presents several problems, the most important being:

Lack of flexibility for the addition of new functions. The evolution of the billings procedures has resulted in the possibility and necessity of measuring and registering new types of values, such as maximum energy demand and differentiated consumption according to the period of the day (hour based tariffs). Since the electromechanical meters are, in fact, mechanical clock mechanisms in their original concepts, they are not compatible with modifications and/or addition of new functions, and their physical design must be altered whenever a new requisite is necessary; and Lack of precision in the consumption measurement, which become excessive with time and under certain electric charge conditions. As their operation is based in the continuous movement of internal mechanical parts, the electromechanical meters present a cumulative wear with time, heavily affecting their nominal precision characteristics, even being subject to failure in registering small electric charges, with the consequent prejudice to the distributing company. Moreover, this type of meter only measures, in an adequate manner, the first harmonic of the line frequency (usually 60 Hz). The increasing introduction of other frequency harmonics into the electric energy distribution systems, mainly caused by switched and intermittent charges, causes the electromechanical meter ceasing to be reliable as a measuring device.

Another aspect refers to the usually employed method of reading the consumption. This method, which involves manually registering the consumption data by employees of the distributing company, who have to walk long distances to collect data from each meter belonging to a given distributing network, which network sometimes can have as much as several thousands meters, can be complicated, time consuming and subject to failures and errors. It is quite common, indeed, that the person in charge of checking the meter can not gain access thereto due to closed gates, absence of people in the house, or by any other reason. In these cases, the distributing companies have to estimate the consumption, based in the average prior measurements of that consumer, sometimes causing distortions in the values to be billed, with the possibility of prejudice either to the distributor or to the consumer.

Moreover, since the reading is carried out visually through the glass cover of the meters, with the notes being taken manually by the person in charge, it is subjected to error, such as those resulting from dirt meters installed in badly lighted locations or in improper positions making it impossible the correct reading of the consumption indication. Finally, the stress to which the distributors employee is subjected, due to the reading of hundreds of meters per day and the writing of thousands of numbers per day, is another component which generates reading errors.

Having described in a generic summarized manner the meter and the method of reading the energy consumption usually employed in the billing of low voltage electric energy, and the main problems and shortcomings associated thereto, it will be described hereinafter the several attempts to obviate the prior art problems so as to demonstrate the high innovative degree and improvements introduced by the present invention in relation to the said prior art.

Referring now to the meter itself, the main attempts to improve it refer to the use of electronic devices and circuits capable of implementing several functions, so as to enhance the flexibility of the electromechanical meter or even to completely substitute it.

In the first case, the electromechanical meters are provided with internal electronic devices and circuits. These circuits and devices are generally made of electronic plates containing integrate circuits (microprocessors, memories, etc), electronic displays and other peripheral elements.

Since the available space within the electromechanical meter is extremely limited not having been foreseen in its original mechanical concept the adaptation of elements additional to its original design, the reliability of the thus formed assembly is less than desired.

Another factor which makes it difficult the use of this solution in the low voltage electric energy billing is its high cost. The meter assembling plus its electronic devices easily reaches higher prices than the single meter, shifting its field of application to those where the measurement is more complex, which is contrary to what happens generally in the low voltage measurements.

Those prior art meters are therefore hybrid solutions, where the portion referring to the measurement itself is carried out by the electromechanical principle, subjected to a great amount of errors with time and upon certain conditions of electric charges, as previously commented.

The second case refers to the attempts of the prior art for a complete substitution of the electromechanical meters for an equivalent totally based on electronic circuits and devices: the electronic meter.

This substitution alternative should theoretically eliminate the problems presented by the hybrid solution (electromechanical plus electronic devices), since measurements, now based on electronic principles, can be more precise and not subjected to disturbing effects on the electric charge side.

It has been partially verified in practice that, when an increasing substitution of the electromechanical measurements for the electronic, mainly in those ranges of electric energy billing corresponding to high and medium voltages, where high energy consumers are located, such as steel processing industries and other heavy industrial plants.

The electronic meters in those ranges of billing generally offer great flexibility as to changes and/or addition of function and a fairly superior precision in the consumption measurements, when compared to the conventional electromechanical meter. The comparative high cost of these meters is largely overcome by these advantages and is irrelevant when compared to the values related to the billing of great amounts of energy.

However, in low voltage billing, which is the area of major interest for the present invention, the cost of the electronic meter has proved to be a major bar to its use, even with the progress occurred in the modern electronic technology.

The main reason for this situation is that the electronic meter, when it offers only the consumption measurement function, or just a few additional functions, has not succeeded in accompanying the lower price of the electromechanical meter.

This difference in prices is of utmost importance when it refers to a market of millions of pieces, as it is the case with the low voltage billing.

In this case, the requirements for improved precision and higher flexibility are not met due to the higher price and the necessity of just a few functions.

The higher price of the electronic meter when compared to the electromechanical results to a great extent from the elements and auxiliary circuits used in the manufacturing of the meter, such as:

power sources for the electronic circuits;

protection elements against disturbs in the electrical network or in the charge (lightnings, short circuits, etc);

voltage and current sensing elements for conforming the levels of those values to the processing capacity of the electronic circuits; and electromagnetic shieldings for preventing the direct irradiation of strong fields of radio frequency.

The next step consists of analysing conceptually the prior art attempts with regard to the improvements in the method of consumption reading and billing.

The attempts of improvement carried out until now make use of one or more of the three concepts which follow.

The first concept is that of the automation of the reading and billing method. The object in this case is to reduce to a minimum human participation, so as to avoid errors and failures such as, for example, in the visual reading of the meters displays, in the manual registering of the consumption and others as above commented.

The second concept refers to the concentration of consumption data, so that the reading and/or transmission thereof to the distributing company offices is carried out in the more efficient manner possible. By concentrating the consumption information of several meters in a single point, the reading can be accelerated and the accessing of groups of meters can be made instead of one by one.

The third and last concept refers to the remote communication. The concern in this case is to eliminate the intermediate steps in the reading method. The remote access, directly from the distributor offices to the consumer meters would be an example of the application of this concept.

A brief description will now be made together with the analysis of examples of the main reading and billing systems proposed by the prior art.

The first example refers to the use of portable computers with reduced weight and dimensions for substituting the spreadsheet normally used by the distributors employee for registering the consumption data. The use of these devices, while facilitating and improving the quality of the employees work, by offering additional information for his use or even automatically carrying out the meter reading, does not eliminate the problems inherent to the access and slowness previously cited, because the human element is still predominant in this method.

The second example refers to those systems in which the meter consumption information is automatically accessed and transmitted to one or more concentrating devices for, finally, being sent to the distributor offices.

The communications means used in those systems can be of many types, including radio waves, energy distribution network wires or even dedicated wires. These systems, which try to combine the three previously cited concepts (automation, concentration, remote communication) have in common a basic design element: The individualized measurement. In other words, all of them are based on individual meters (one unit per consumer), either of electromechanical or electronic technology. In these meters devices and circuits are added, so as to allow automatic or remote communication, significantly increasing the cost of the measurement.

The third and last example, which refers basically to the billing instead of reading, is directed to the systems where the consumer automatically buys certain amount of energy, using for example coins, cards or numeric passwords. By using appropriate interfaces in the meter (a coin counter, a card reader or a numeric keyboard), the consumer makes a credit corresponding directly to the meter. The consumed and the remaining energy are shown in a display to the consumer, for its control in the acquisition of additional credits. This type of system, due to the inclusion of displays, interfaces for the reception of the meter energy credit (coin counter, card reader or numeric keyboard), increases several times the total price of the measuring operation. In view of this, it is only used in special cases for consumers of great amounts of energy, where the high implantation costs are justified.

In summary, the increase in the costs of the measurements have been frustrating prior art attempts in providing improved reading and billing systems, without increasing too much the final price. The main reason for that results from the fact that those systems are based on individual meters, where any added device represents an irreversible increase in the price.

Having analyzed the measurement and reading/billing systems of the prior art, attention will now be given to the more serious aspect found in those cases of agglomeration of consumers such as, for example, apartment buildings. This aspect refers to the physical space occupied by the measurement facilities. In the case of the prior art, which can use several hundreds of units in large building, this implies in the allocation of large areas generally in the ground level of the building. Those areas for the installation for the meters some times are located in noble areas of the building such as lobbies or within specially built rooms. Any one of these cases mean a waste or bad utilization of the available area of the building.

SUMMARY OF THE INVENTION

Once characterized the main aspects of the prior art, the object and summary of the invention will now be described:

a) to provide a centralized electric energy consumption measurement, near high consumer concentrations, such as apartment buildings, which allows centralized reading and billing manually and/or automatically, with local and/or remote access, without the problems and shortcomings of the prior art. The use of a centralized measurement instead of individual meters common to the state of the art, allows the improvement of the consumption measurement itself, the electric energy reading and billing, without undue increase of the costs, since the devices which are added to the measurement process have their costs shared with the several elements of the centralized system;

b) to provide a centralized measurement of electric energy, where the individual meter used by the prior art are substituted for energy transducer modules. These modules, designated as ETMs, having physical dimensions smaller than those of the prior art meters, can be grouped in a large number within a same box, designated as measurement unit (MU);

c) to provide a centralized electric energy consumption measurement, wherein the ETMs share the common parts of the MU, such as the power supplies for the electronic circuits, electric network protection elements, voltage sensors, registering, control and communication circuits contained at the MU;

d) to provide a centralized electric energy consumption measurement, wherein the MU also contains an ETM designed to measure the highest electric charges, designated as "service ETM". The "service ETM" is responsible, in the case of apartment buildings, for measuring the energy consumption of electric pumps, central air conditioning systems, elevators and illumination of the common parts of the building, while the consumption measurement of the apartments is carried out by the normal ETMs;

e) to provide a centralized electric energy consumption measurement, which, besides the normal and service ETMs, has a "global ETM", responsible for the measurement of the total electric energy supplied to all the consumers related to a given MU. The "global ETM" allows comparison of the sum of the measurements made by the individual ETMs, including the service ETM, and the total measurement, so as to facilitate the detection of frauds, illicit energy deviations and possible defects of the centralized measurement system;

f) to provide a centralized electric energy consumption measurement, wherein the consumption information, provided by the normal, service and global ETMs, are collected and registered in a non volatile manner, by a register/concentrator module (RCM), also located inside the MU. Besides the collection and registering, the RCM is also responsible for the communication of the MU with outside located means;

g) to provide a centralized electric energy consumption measurement, wherein the consumption data from one or more MUs can be accessed from a single central point. Amongst the various possibilities, one can cite a system where the measurement can be locally carried out, by means of an external reading unit (RU), provided with display means for visual access to the registered consumption data and a device for connection with portable readers, thus also allowing the automatic reading of the consumption data. Another possible system would be, among others, the direct transmission of the data from the MUs to the distributor offices, utilizing appropriate interfaces at the RCM, for its dissemination through radio waves, wires of the electric energy distribution network itself or even by the telephone lines. However, one must have in mind that this external reading unit (RU) is not part of the present invention, whereby it will not be described herein more detail;

h) to provide a centralized electric energy consumption measurement, with the RCM being provided with processing capacity, for example by using a microprocessor, which would allow the implementation of multiple energy tariffs, such as an hour based tariff ("seasoned tariffs"). In this case, the RCM provided with a clock having an internal calendar or an interface for reception of remote command signals, can carry out the energy registration in a differentiated manner, separating the consumption in terms of hours, days or months. In this manner, these functions can be implemented in a single point, more accessible to the person in charge of reading the information. Besides, there is no necessity of alterations at the MUs, due to the functional evolutions of the reading and/or billing system, such as changes in the tariff. Such functions could be alternatively executed by the RCM itself. These two systems also make possible the switching of electric charges for the purpose of energy conservation and/or improvements in the quality of the services provided for by the distributor company. In this case, some charges, such as a central, air conditioning system, electric pumps and heaters can be remotely controlled, contributing therefore with the reduction of consumption peaks in the electric energy distribution network; and i) to provide a centralized electric energy consumption measurement, which allows its installation in already existent buildings, without the necessity of additional civil construction. The MU can be dimensioned so as to be installed at the same physical space occupied by the conventional distribution boxes, usually employed by the distributor company for connecting the consumer related wires to the supply bar, which is, in turn, directly connected to the public energy distribution network. In this manner, not only additional civil construction and changes in the existing electric system can be avoided, but the conventional meters can be discarded, thus gaining more space at the construction. Tampering and frauds attempts are rendered more difficult.

In summary, the present invention allows the centralized measurement of electric energy consumption from one or more centralized measuring units (MU), one or more reading/billing units (RU) and the communication means between the MUs and RUs.

The MU consists, in its basic version, of a box containing:

energy transducer modules (ETM), which substitute the conventional electric energy meters;

energy transducer module for high charges ("service ETM");

energy transducer module for total energy measurement referring to all the consumers associated to the MU ("global ETM");

register/concentrator module (RCM) for collecting and non volatile registering of the consumption information of all the ETMs of the MU, control of the functioning of the remaining circuits of the MU, and communication of the MU with external means; and power supply for the electronic circuits, voltage sensors, protection elements and communication circuits.

The RU is a unit external to the MU, and which function is to allow local or remote access to the consumption information, as registered at the MUs to which it connects. The RU, considering the knowledge available from the state of the art, can be implemented so as to effect the visual presentation of the information, automatic and/or remote communication with the distributor offices, local emission of bills and pre payment schedules.

The communication means between MUs and RUs can be those of the prior art, such as data communication via radio short waves, dedicated lines and even wires from the distributing network itself. Once the said communication means are widely known from the state of the art, and do not make part of the present invention, they will not be described in further details.

The system object of the present invention, due to its capabilities of convenient communication/control and location (near the energy distribution branches for the consumers), allows the switching of electric charges according to predetermined programs and/or remote control signals.

BRIEF DESCRIPTION OF THE DRAWINGS

The objects of the invention, its characteristics and advantages will be better understood with the description of its preferred embodiment, made with reference to the attached drawings, of which.

DESCRIPTION OF THE PREFERRED EMBODIMENTS

Figure 1:
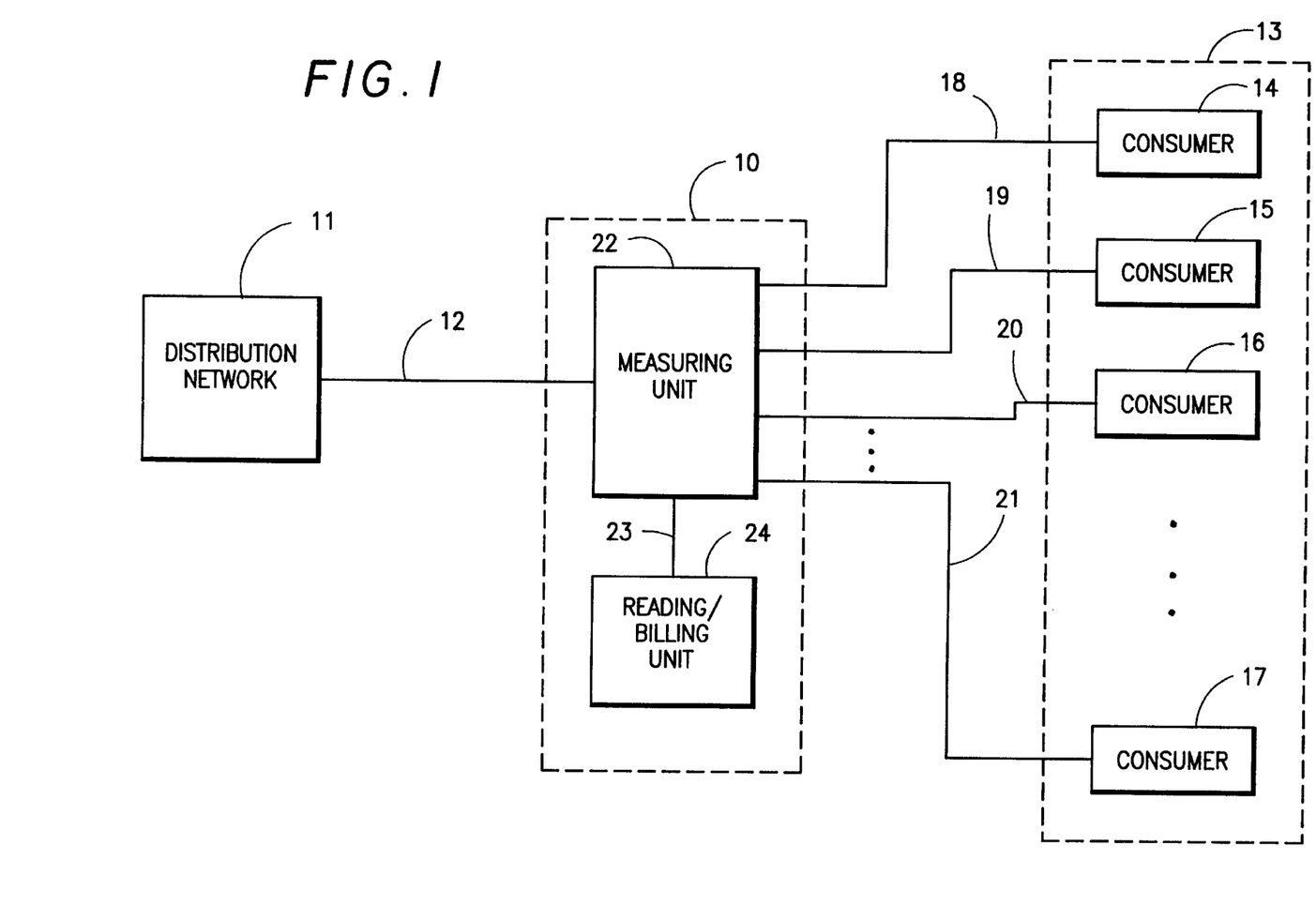
FIG. 1 is a generic block diagram, showing representations of the consumers associated to an installation provided with the equipment for centralized measurement, registering, reading and billing, in accordance with the preferred embodiment of the invention.

The following elements can be schematically seen from FIG. 1:

a concentration of consumers 13, which can be, for example, an apartment building;

the distribution of electric energy for the concentration of consumers 14, 15, 16, 17, through electric conductors 18, 19, 20, 21;

the centralized measuring, registering, reading/billing equipment 10, and its main components: the centralized measuring unit MU-22, the centralized reading/billing unit RU-24 and the data communication means 23;

the electric energy distribution network 11 and the inlet electric cable 12, which supplies energy to the said concentration of consumers 13 through the distribution carried out in the centralized measuring, registering, reading/billing equipment 10.

As it can be seen from this figure, the centralized measuring unit MU 22, from now on simply designated as MU 22, can, conveniently, effect the distribution and measurement of energy delivered to the consumers 14, 15, 16, 17. These consumers can even include some which make use of the said high electric charges, such as those found in buildings and usually designated as "service" charges, and which may include water pump electric motors, central air conditioning systems, elevators and illumination circuits for the common parts of the building.

Once the energy is distributed, through MU 22, from the inlet electric cable 12 coming from the electric energy distribution network 11, it is possible to detect failures, tamper attempts, frauds or similar, by comparing the energy measurements received through the inlet cable 12 and that distributed through the consumer connecting conductors 18, 19, 20, 21.

If a very large number of consumers is provided in the installation 13, and/or the formation of sub groups of consumers is considered necessary, several MUs 22 can be employed. Accordingly, each MU 22 would be in charge of the centralized distribution and measurement with regard to its associated sub group of consumers. The consumption information registered in each one of the MUs 22 could be periodically passed to one or more centralized reading/billing units RU 24. Preferably, the RUs would carry out a scanning of all the MUs to collect the information regarding the occurrence of energy pulses for each consumer.

It must be observed that each measuring unit (MU) contains only the information regarding the occurrence or not of an energy pulse for each consumer, within a scanning period. The accounting and accumulation of those energy pulses can be made by a programmable electronic register (not shown), which must be installed within the RU.

This register, which may even be a conventional PER (programmable electronic register), normally used in the measuring of high and medium voltage, with its software modified, must be capable of communicating with the MUs through a serial inlet, interpret the communication protocol, store all the information regarding the consumers and display the information referring to each consumer.

Figure 8:
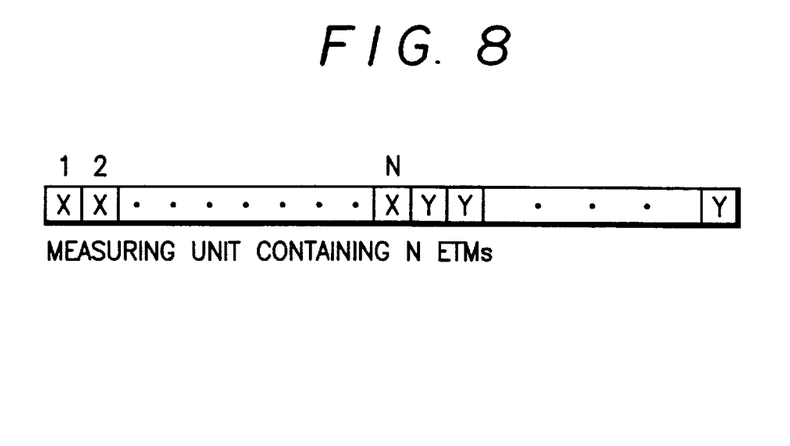
FIG. 8 schematically illustrates the bit string sent by the centralized measurement to the centralized reading/billing unit.

Periodically, the microprocessor of this register selects, through the dedicated bus bars or through the network itself, one MU at each time. Having carried out the selection, the microprocessor of the selected MU responds to the RU microprocessor by sending a bit string, which contains the consumption information. This bit string is schematically shown in FIG. 8, where, if x=1, then there is an energy pulse in the current scanning period; if x=0, then such pulse does not exist. The Y bits are used for the detection and correction of communication errors.

All the responsibility for the storing of information in case of energy failure is on this register.

This register must be provided with an optical connector for allowing communication with a radio transceptor and/or with a portable reader. The radio transceptor is addressed via another transceptor, carried by a distributor employee, which is in the vicinity of the building being considered. By means of a command emitted by the said employee, all the information contained in the register are transmitted to his transceptor, which must be connected to a portable reader.

If the use of radio transceptors is not desired, the employee may connect its portable reader to the register optical connector, then carrying out locally and automatic reading of all the information referring to the consumers, or even manually taking notes of the values displayed at the register.

The data communication means 23 between one or more MUs 22 and the RU 24 can be chosen among the various devices available from the state of the art, such as those using radio transmission, conductors of the distribution network itself or via dedicated wires (coaxial cables), which can pass through the same ducts used for the energy distribution cables for the apartments.

Since the equipment capable of implementing this data communication means 23 are already known from the state of the art, and is not a part of the present invention, it will not be described in further detail. In any case, some data communication means have been described at the "VI International Conference on Electricity Supply Measuring and Billing Apparatus", held from Apr. 3 to 5 of 1990 in Manchester, United Kingdom.

The RU 24 allows suitable access from a single point, to the consumption information of one or more MUs 22, referring to the installation 13. Considering specific conditions of the installation 13 and of the prior art knowledge, several solutions and configurations for the transmission of consumption data until the distributor offices can be utilized, such as:

- the RU 24 may consist of a conveniently located unit at the installation 13, where visual readings regarding the consumption and other information related to the one or more MUs 22 of the installation 13, can be locally made through the display. Besides, the RU 24 can effect reading of water and gas meters, from suitable adaptations made to these meters;
- the RU 24 can be provided, besides the display for visual reading, with an optical interface for connection with portable readers, thus allowing automation of the local reading; and
- if a remote consumption reading is of interest, it is possible to provide the RU 24 with means known from the state of the art, for the transmission of the consumption data, using, for example, radio waves, telephone lines or transmission through the conductors of the electric energy distribution network 11 itself. In the latter case, processes of transmission on an expanded spectrum of frequencies (generally known as "spread spectrum"), can be used. A local concentrator can put together all the information of several MUs 24, referring to several installations 13, transmitting it in a suitable manner until the distributor offices, for example, by means of a telephonic modem. If considered convenient, the MUs 22 themselves can carry out this transmission function for remote reading, using the already exemplified means, and the RU 24 can be disregarded.

As already mentioned, the RU is not an essential part of the invention and, accordingly, its constructive details will be omitted herein. In any case, several devices are known from the state of the art, which are capable of implementing the functions of the RU, as above described. An example of this device would be the one described in the UK patent 2,046,924.

If the necessity of utilizing one or more individual meters in the installation 13 persists, these could be provided with suitable interfaces for connection to the centralized measuring, registering, reading/billing equipment 10, either through the MU 22 or directly to the RU 24.

In the examples of configurations of the equipment 10, in which the RU 24 is a remote element, or does not exist as a function of the data transmission capability of the MUs 22, it could still be necessary to have the possibility of visual and local reading of the consumption data at the installation 13. One possible reason to this could be, for example, to provide a consumer with the right to have free access to the reading of the data pertaining to its consumption. In this case, it could be used as an auxiliary reading unit or a display could be provided in the MUs 22, thus allowing the consumer locally to check the consumption associated to his apartment.

Figure 2:
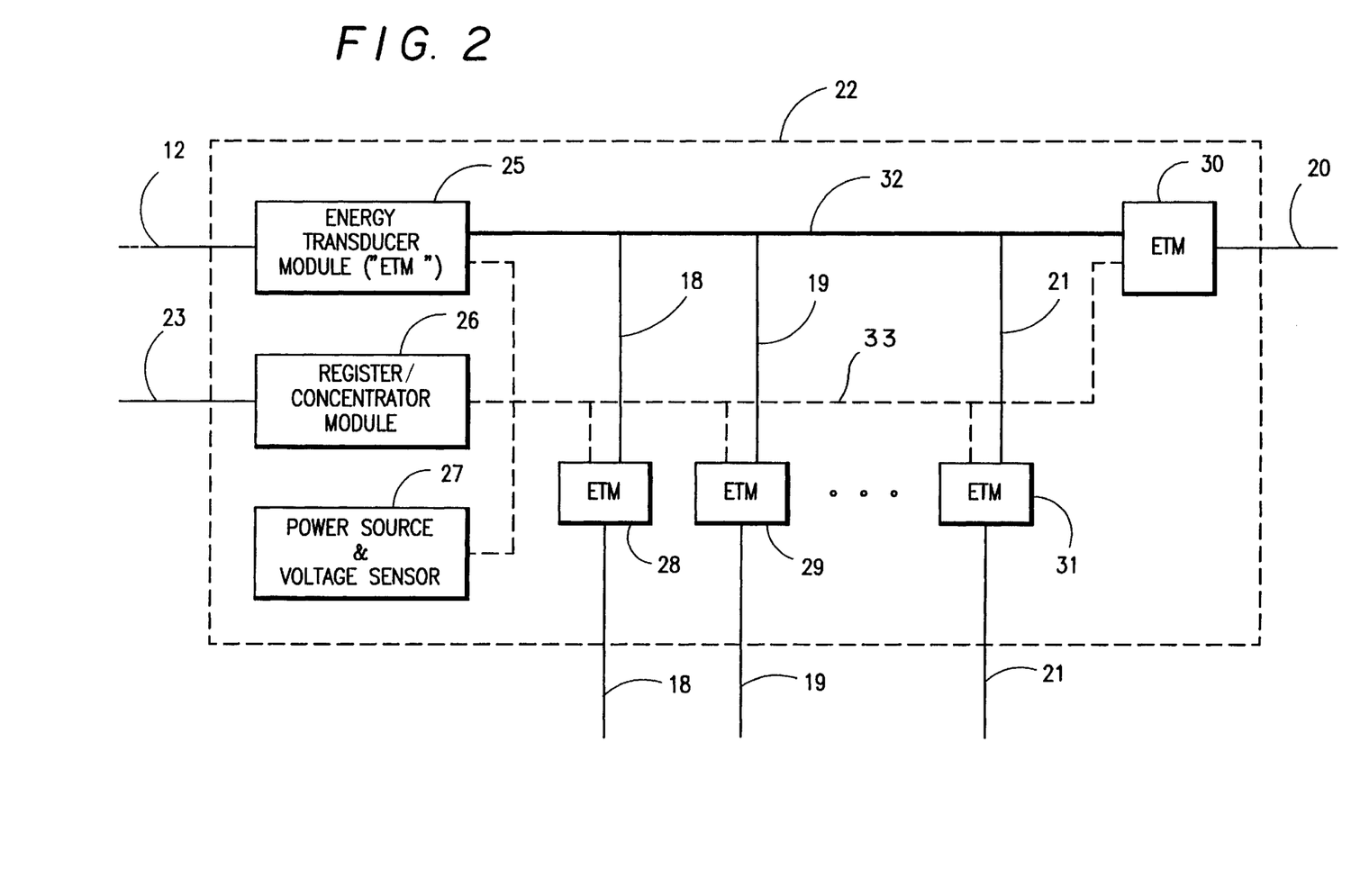
FIG. 2 is a block diagram of an embodiment of the measuring unit (MU) shown in FIG. 1.

FIG. 2 represents a basic scheme of the internal arrangement of a MU 22, according to a preferred implementation of the invention, having the following elements:

- the inlet electric cable 12, which supplies all the energy to the consumers associated to the MU 22;
- the electrical conductors 18, 19, 20, 21 for the consumer connection to the installation 13, as already explained with reference to FIG. 1;
- data communication means 23 between the MU 22 and the RU 24, and/or external means (in the case of a remote data transmission from the MU 22 itself);
- the energy transducer modules (ETM) 28, 29, 30, 31, responsible for the measurement of electric energy consumption. Each ETM is associated with one consumer of installation 13;
- the ETM 30 for the high charges generally associated to common electric circuits and building service installations;
- the "global ETM" 25, referring to the measurement of all the electric energy entering the MU 22, which is to be distributed to the consumers associated thereto;
- the register/concentrator module (RCM) 26, responsible for collecting and registering the consumption information supplied by the ETMs 25, 28, 29, 30, 31, for the controlling of the operation of the MU 22, for the data transmission to the RU 24 and/or external means, and for the visual presentation of the consumption information through a display, if this is the case;
- power supply module and voltage sensors 27, containing the power supplies for the electric and electronic circuits of the MU 22 and the voltage sensors, which adequate the levels of electric voltage present in the conductors 18, 19, 20, 21, reducing them to levels compatible with electronic process for determining the energy at the ETMs 25, 28, 29, 30, 31;
- data, signals and supply bus bar 33, which provides interconnection between the several elements of the MU 22, such as the ETMs 25, 28, 29, 30, 31, the RMC 26 and the power supply/voltage sensors module 27; and
- the electric energy distribution bus bar 32, where the energy delivered from the inlet cable 12 is distributed to the consumers served by the MU 22 through their individual connections 18, 19, 20, 21.

The main energy inlet cable 12, already shown in FIG. 1, supplies all the energy to be distributed to the consumers associated to a given MU 22. The use of the "global ETM" 25 at the inlet of the MU 22, allows the measurement of all the energy in a natural and easy manner.

The energy is distributed to the consumers through connection of the electrical conductors 18, 19, 20, 21, made directly with the energy distribution bus bar 32, which is connected to the cable 12. This bus bar 32 consists, in the preferred implementation of the invention, of bus bars vertically positioned inside the MU 22, wherein, through screw and terminal type connections, are connected the energy conductors which supply the consumer units 14, 15, 16, 17. This distribution solution is coincident with the practice presently adopted by electrical energy distributing companies and, therefore, benefits from already proved procedures.

The energy conductors 18, 19, 20, 21, which supply the consumer units 14, 15, 16, 17, upon connection to the bus bar 32, pass through current sensors 34 (shown in FIG. 3) of the ETMs 28, 29, 30, 31, causing the consumption measurement to happen in an automatic manner, that is to say, in order to make a connection of a consumer, an associated ETM 28, 29, 30, 31 is already provided.

The "global ETM" 25 has its sensors 34 crossed by the cable 12, connected to one of the ends of the bus bar 32, thus allowing the the total energy measurement delivered to a MU 22. To the other end of the bus bar 32 are connected, via sensors 34 of the service ETM 30, the conductors referring to the highest electric charges, usually related to the services common in building installations, such as water pump motors, central air conditioners, elevators and illumination in general. Both the sensors 34 of the "global ETM" and those 30 of the service ETM have a dimensioning adequate to the high electric currents present in cable 12 and conductors 20 for supplying energy to heavy charges.

The consumption information, provided by ETMs 25, 28, 29, 30, 31 is collected by RCM 26. This consumption information is transmitted through the signal and supply bus bar 33, which interconnects the RMC 26, ETMs 25, 28, 29, 30, 31 and the power source/voltage sensors module 27. If individual consumption meters are provided outside the MU 22, the consumption information determined thereby are collected through the external communication means 23 of MU 22, or by direct connection to the RU 24, as previously mentioned.

In the distribution of electric energy, in view of the field of application of the present invention, the voltage, namely the level of electric tension, present in the supply conductors 18, 19, 20, 21 of the consumers 14, 15, 16, 17, of an installation 13, such as an apartment building, is determined by the voltage at the electric cable 12. Since this voltage is common to the MU 22 consumers, a single group of voltage sensors (not shown) is necessary for the determination of the voltage which is present in all the energy conductors of these consumers. This information, which refers to the level of electric voltage at the cable 12 is generated by the voltage sensors of the power source/voltage sensors module 27, and transmitted by the bus bar 33 to all ETMs 25, 28, 29, 30, 31 of MU 22. The information consists of electric voltage signals of reduced amplitude, proportional to the voltage at the cable 12, and appropriated to the processing by the electronic circuits of the ETMs 25, 28, 29, 30, 31. The generation of these signals is made, according to a preferred embodiment of the invention, by voltage transformers using magnetic materials, shieldings for protection against electric noises and insulation against high voltage disturbances present in the distribution network 11, in a precise and careful manner, since its cost is shared by the number of ETMs 25, 28, 29, 30, 31 served thereby. In this manner, the invention provides levels of performance, protection and reliability higher than those of the prior art, without undue increase in the costs.

The above mentioned voltage sensors are known per se as, for example, from FR no 2,522,156. The same can be said with regard to the power sources 27 of the electronic circuits of the modules contained in the MU 22. This supply, which is distributed to the ETMs 25, 28, 29, 30, 31 and RCM 26 through bus bar 33, is of common use in relation to the MU 22 electronic circuits and, therefore, has its cost shared. In this manner, the power sources 27 can have high levels of performance, protection and reliability, such as those which are found in prior art designs, which use redundance, electromagnetic shieldings and overdimensioning, without excessive increase in the costs. A power source of this type is known from Brazilian Patent Application PI 8504693.

The RCM 26 has a microprocessor, a ROM (read only memory) containing the respective software and a RAM (random access memory) sufficient for storing the energy pulse occurrences of all the ETMs. The main function of these devices is periodically to collect consumption information, obtained from the ETMs 25, 28, 29, 30, 31, its processing and non volatile registering, and the consumption data transmission through communication means 23, such as, for example, a single coaxial cable, via radio, or via the electric energy conductors themselves, as previously mentioned. This transmission can be carried out until the level of the local or remote RUs 24, in relation to the installation 13.

Practical examples of RCMs are those described in UK 2,149,128; EP 0 015 120 and U.S. Pat. No. 4,516,213.

Since the RCM 26 is provided with a microprocessor, work memories, programs and non volatile data, it can execute in an extremely reliable and flexible manner the functional of collecting, registering, processing and transmitting the consumption data referring to the consumers 14, 15, 16, 17 of the installation 13. The RCM 26 can also be provided with electronic clock circuits, facilitating the registering of instantaneous occurrence of events at the MU 22, which are of interest for the electric energy distributing company.

The use of interfaces for the bidirectional communication between the RCM 26, through the communication means 23 of the MU 22, allows flexibility in the charge control schemes from, for example, contactors directly controlled by the RCM 26, or even the implementation of tariffs where the consumption must differentiated according to the hour of the day, usually known as seasoned tariffs.

As an additional observation, it could be pointed out that the MU 22 can be provided with a device for communication with portable automatic readers through, for example, electrical or optical connectors.

Besides, since the RCM 26 is provided with intelligence (a microprocessor), the several methods known to the state of the art can be implemented, with regard to attempts of violation of the MU 22, or unauthorized access or reprogramming; and the implementation of a differentiated tariff does not require changes in the system of measurement, but only in the corresponding software, which will then count the pulses according to differentiated parameters.

Figure 7:
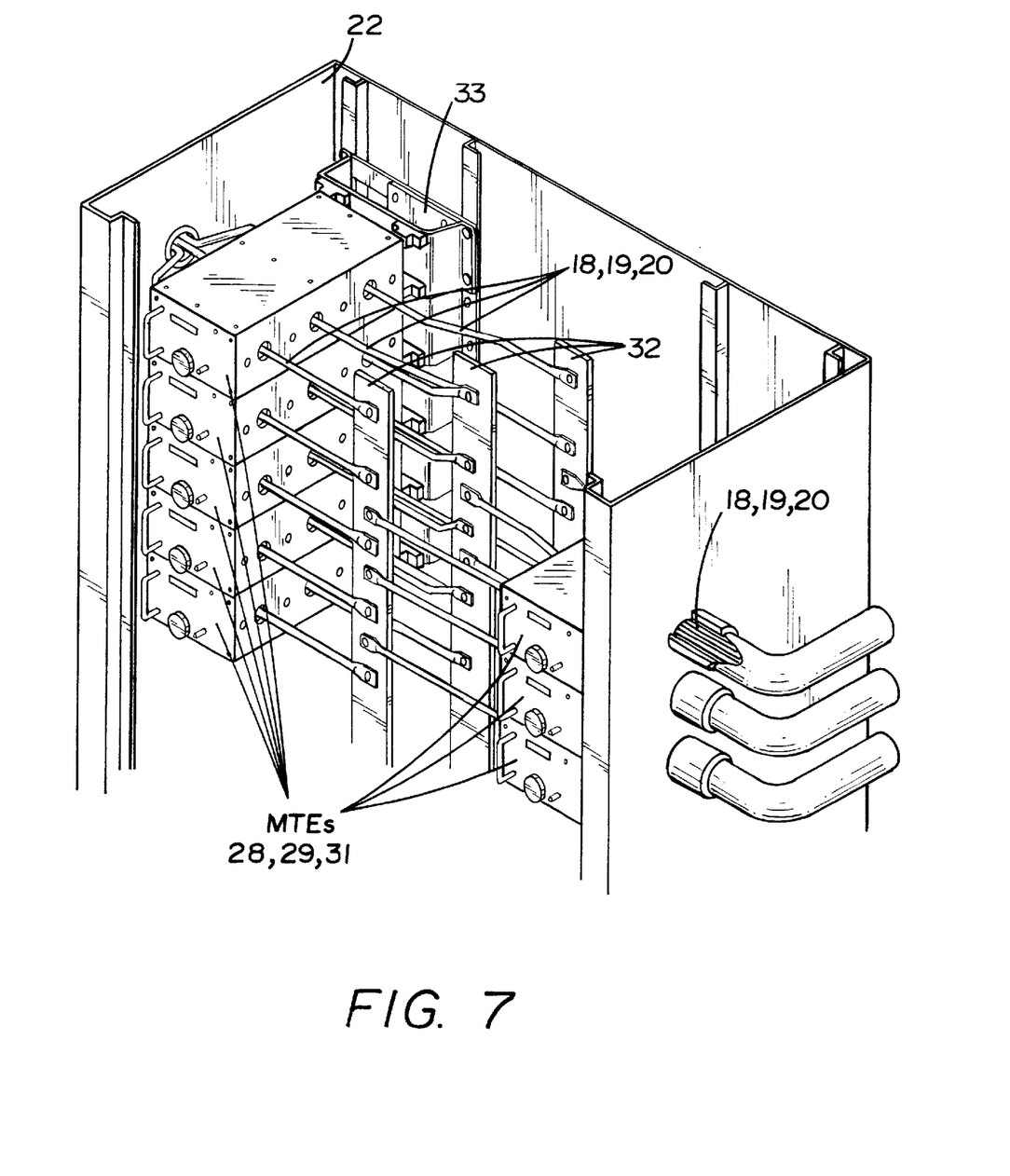
FIG. 7 is a drawing showing an internal view of the MU, with the ETMs, distribution bus bars and electrical connections for the consumers.

Moreover, according to the preferred embodiment of the invention, the component blocks of the MU 22, such as the ETMs 25, 28, 29, 30, 31, RCM 26 and power source/voltage sensors 27, can be mounted according to the concept of "plug provided modules", which can be pressure connected inside the MU 22, with the help of guide rails, thus facilitating the installation, servicing and field substitution (FIG. 7).

The above mentioned blocks can be made in the form of shielded units, without the possibility of disassembling for internal access, thus making any tampering attempt more difficult. Another alternative would be making the said blocks in the form of units capable of being disassembled, for easier servicing, but provided with tamper indicating means, with a non volatile register at the RCM 26. Such options can be defined as a function of the distributing company interests or operation philosophy.

According to the preferred embodiment of the invention, the bus bar 33 for the interconnection of the blocks of the MU 22, is located within a shielded conduct inside the MU 22 box, thus preventing fraud attempts by interferences in the external signals which pass thereto (FIG. 7).

Figure 3:
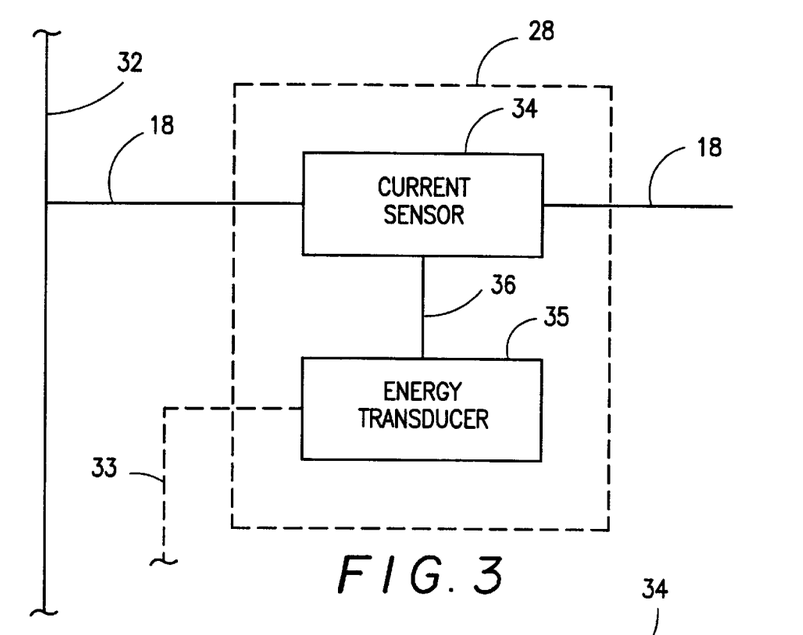
FIG. 3 is a block diagram of an embodiment of the energy transducer module (ETM) shown in FIG. 1.

FIG. 3 presents a simplified diagram, showing the internal arrangement of one of the ETMs, in this case the one indicated by reference number 28 in FIG. 2, according to the preferred embodiment of the invention, where the block of current sensors 34, the energy transducer circuit 35 and the connecting element 36 between them, are illustrated.

Comparing the arrangement of the present invention ETMs 25, 28, 29, 30, 31, with those of the prior art meters, it is clearly seen that the centralized measurement in accordance with the invention allows the omission of several elements, such as voltage sensors and associated protection devices, power sources and related protection devices, display means for the consumption related values, connecting terminals for the electric current conductors, a housing or box for external installation, covers and fixing means thereto. Those elements are implemented in the common use blocks of the MU 22, which costs are shared by all the ETMs 25, 28, 29, 30, 31, as already explained. This great simplification allows the ETMs to be made with a more compact design and housed in simple and strong boxes, having a cost lower than that of an electromechanical meter, and having the capability of being installed in a large number inside the MU 22, without exceeding the typical conventional dimensions of the boxes, which would also be substituted according to the invention. This simplification means highly reduced costs, when compared to the measurement solutions offered by the prior art.

The installation of the ETMs 25, 28, 29, 30, 31 is additionally simplified, since, being "pluggable units", they can be inserted as "drawers" into the guides existing in the box of the MU 22. When inserted, a male connector, integral with each ETM fits into a corresponding female connector provided at the bottom of the space where the "drawer" is being inserted into.

The connection through these two connectors allows that each module connects to the shielded signal, data and power supply bus bar 33 (FIG. 7).

Figure 4:
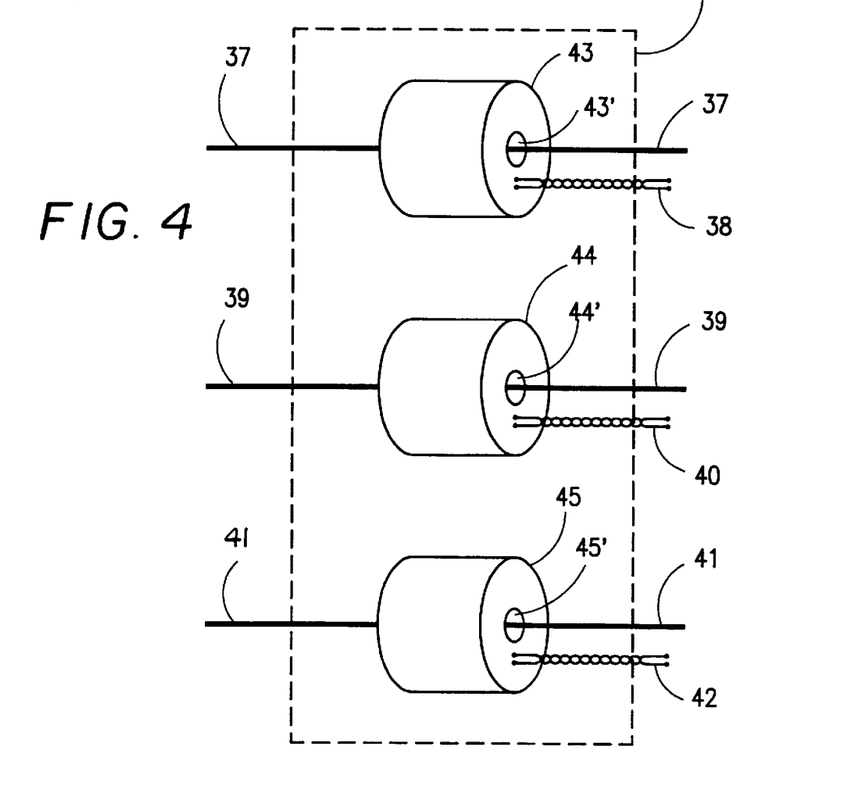
FIG. 4 is a diagram representing an embodiment of the block of current sensors of FIG. 3.

FIG. 4 shows the basic arrangement, according to the preferred embodiment of the invention, for the current sensors 34 employed in the ETMs 25, 28, 29, 30, 31. This configuration with three transformers 43, 44, 45 represents a polyphasic distribution arrangement. Other distribution can be attended with a variable number of transformers, according to the particular case (monophasic: 1; biphasic: 2), without prejudice to the scope of the invention. UK 2, 143,955 describes a transformer of this type.

The current transformers 43, 44, 45 are, preferably, of the toroidal type, where the conductor 37, 39, 41, which carries the electric current to be transformed is the primary winding itself, passing through orifices 43', 44', 45', and making unnecessary additional connectors or connecting wires, for electrical connection with the electric charge which consumption is intended to be measured.

This type of sensor, thanks to its toroidal configuration, presents a high performance and great immunity to external electric fields, and can be made of low cost and average performance magnetic materials.

The absence of additional connectors and wires reduces the mounting costs, increasing its reliability and durability upon overcurrents and overheating of the conductor 37, 39, 41, which acts as the primary winding, during abnormal conditions which can occur in the supplying of electric energy.

The pairs of braided cables 38, 40, 42 represent the outputs of the transformers 43, 44, 45, supplying currents of reduced amplitudes, but proportional to those found at the primary conductors 37, 39, 41. These currents, usually designated as secondary currents, have amplitudes suitable to be processed by the electronic circuits of the energy transducer 35.

Figure 5:
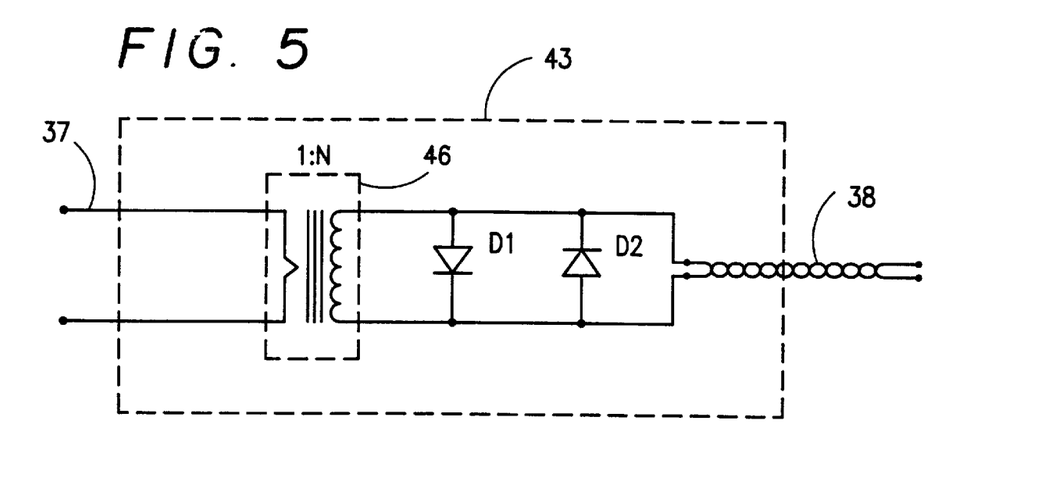
FIG. 5 is an electric diagram of an embodiment of the current sensor of FIG. 4.

FIG. 5 represents the invention preferred scheme for the implementation of the electrical protection of the current sensor 34 of the ETM 25, 28, 29, 30, 31.

The toroidal current transformer 43, 44, 45, according to a preferred embodiment of the invention, consists of a transformer 46 with its primary winding formed by the conductors 37, 39, 41 themselves, which carry the current of the consumer 14, 15, 16, 17, as already mentioned, and a secondary winding which, before connecting to the output wires 38, 40, 42, is protected by semiconductor diodes D1, D2. These two diodes limit the maximum output voltage (38, 40, 42) of the transformer 46, protecting it against overcurrent failures at the primary side (37, 39, 41) and allowing its handling even during operation, in safe manner, with no risk of saturation of the magnetic material or damages to the insulation at the secondary side.

Figure 6:
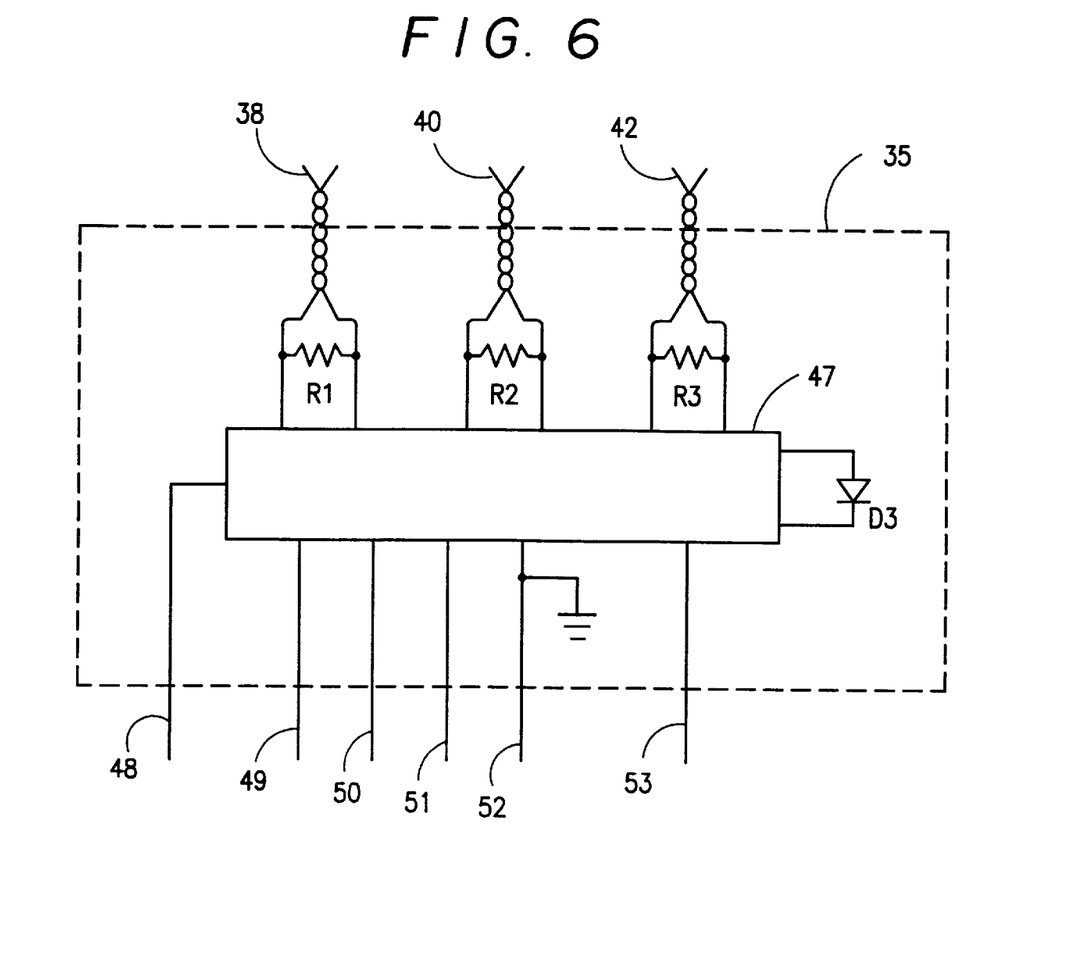
FIG. 6 is a diagram representing an embodiment of the electronic energy transducer of FIG. 4.

FIG. 6 illustrates the basic elements which form the energy transducer 35 circuit. The signals used by the transducer 35 are those which make part of the interconnection bus bar 33, such as, the supplying 48 for the electronic circuit 47, the wires 49, 50, 51, 52, which carry the voltage proportional to the input of the conductors 18, 19, 20, 21, which feed the consumers 14, 15, 16, 17, and those supplied by the outputs 38, 40, 42 of the current sensor 34. In the preferred implementation of the invention, the output current from the current sensor 34, which is proportional to the input at the conductors 18, 19, 20, 21 feeding the consumers 14, 15, 16, 17, is converted through electric resistors R1, R2, R3 in voltage, which is a form of signal more appropriate to processing by the electronic circuit of the energy transducer 47.

According to a preferred embodiment of the invention, this electronic circuit 47 is responsible for multiplying the current and voltage signals, for its integration and for the generation of energy pulses. These energy pulses are sent until the RCM 26 through bus bar 33, which connects all the ETMs 25, 28, 29, 30, 31 thereto.

Still according to the preferred embodiment of the invention, the output 53 of the electronic circuit of the transducer 47 consists of electric pulses representing, in a discrete manner, suitable to its processing by the RCM 26, the energy delivered to the consumer 14, 15, 16, 17.

Still according to the preferred embodiment of the invention, a visual output is provided for the accounting signal 53 of the consumed energy, through the light emitting diode D3. In this manner, individual calibration and monitoring procedures for each ETM 25, 28, 29, 30, 31, including the centralized measuring, registering, reading and billing equipment 10, which is installed and operating, can be easily implemented.

Still according to the preferred embodiment of the invention, the energy transducer 47 electronic circuit is based on an integrated circuit dedicated to the consumption measurement function, allowing maximum reduction of the number of electronic components of the ETM 25, 28, 29, 30, 31, thus reducing its cost and improving its reliability. Dedicated integrated circuits as above mentioned are known from the state of the art and, for example, described by T. L. J. Salo in "A static Domestic Watt-Hour Meter with Custom Designed Integrated Circuit", V IEE MATES Conference Proceedings, Edinburgh, Scotland, pages 126–128, 1987; and in FR 2 555 318.

Any person skilled in the art can easily recognize that the invention has other possibilities of implementation, without affecting its scope, such as, for example:

a) the ETM 25, 28, 29, 30, 31 can be made in such a manner that only its current sensors remain as independent modules, as illustrated in FIGS. 3 and 4. In this case, the secondary currents representing the electric currents of the consumers 14–17 are sent through the signal and power supply bus bar 33 until the RCM 26. The RCM 26 would then process these currents, directly determining the electric energy consumptions, and not through the ETMs. For this processing it could be used, inside the RCM 26, electronic circuits dedicated to each sensor 34 or a single high speed circuit, scanning all the sensors in a time sufficiently short, so as to meet all the necessary measurement requirements. In this latter case, it could be used, for example, schemes based on microcontrollers, analog/digital converters and multiplexer analogic switches, for a centralized processing at the RCM 26, of all the signals from the sensors 34 at the MU 22; and b) the sensors 34 could be implemented, if desired, from other technologies different from the one using the toroidal transformers 43–45 used in the present invention. Some examples are resistive elements (shunt type) serially connected with the electric circuit 18–21 from the consumers 14–17, or transformers with non-toroidal configuration (E-I type), or semiconductors based on the magnetic principle of operation (Hall effect types).

Figure 9:
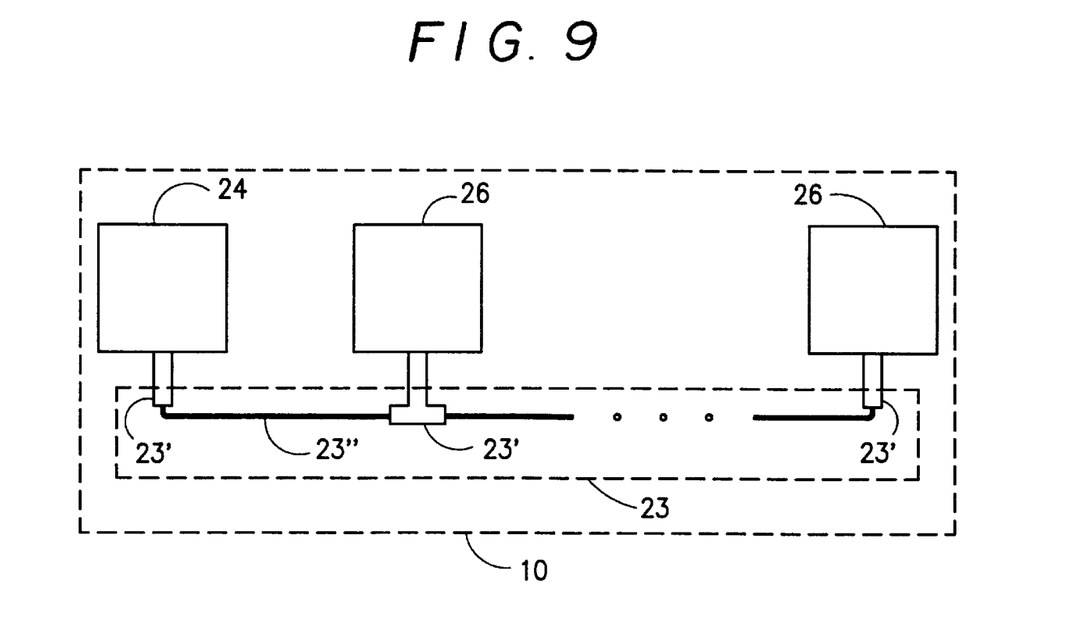
FIG. 9 shows a preferred implementation of the interconnection of the several blocks which form the system object of the present invention.

FIG. 9 shows the preferred embodiment of the interconnection of the centralized measuring equipment 10, where it can be seen the RU 24 and several MUs 26, and the interconnection means 23 formed by coaxial cables 23" and BNC type connectors 23', through which the RU 24 communicates with the MUs 26.

The RU 24 collects, through its interconnection means 23, the data referring to the consumption of each consumer 14–17, the consumption of the service areas, the total consumption of the branch corresponding to each MU 26 and to the total building consumption. It also collects, through the interconnection means 23, information on the operating state of each ETM 25, 28, 29, 30, 31; and it is also capable of collecting the energy pulses generated by an external energy meter 61, through a suitable connection (see FIG. 8).

The RU 24 also stores the date and hour of the acquisition of data referring to the consumption measured by each ETM.

Figure 10:
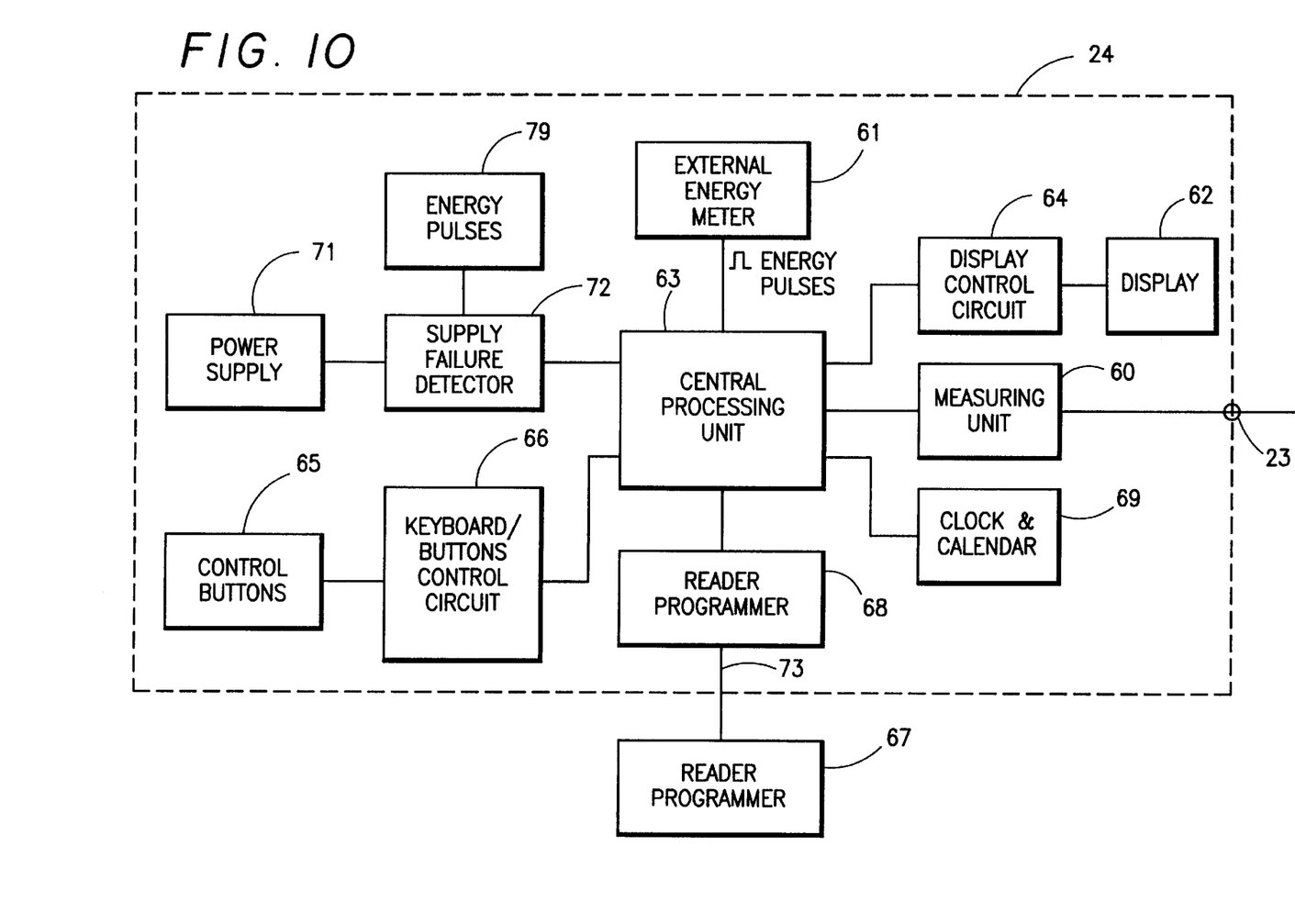
FIG. 10 is an schematic representation of a preferred implementation of the centralized reading/billing unit.
Figure 11:
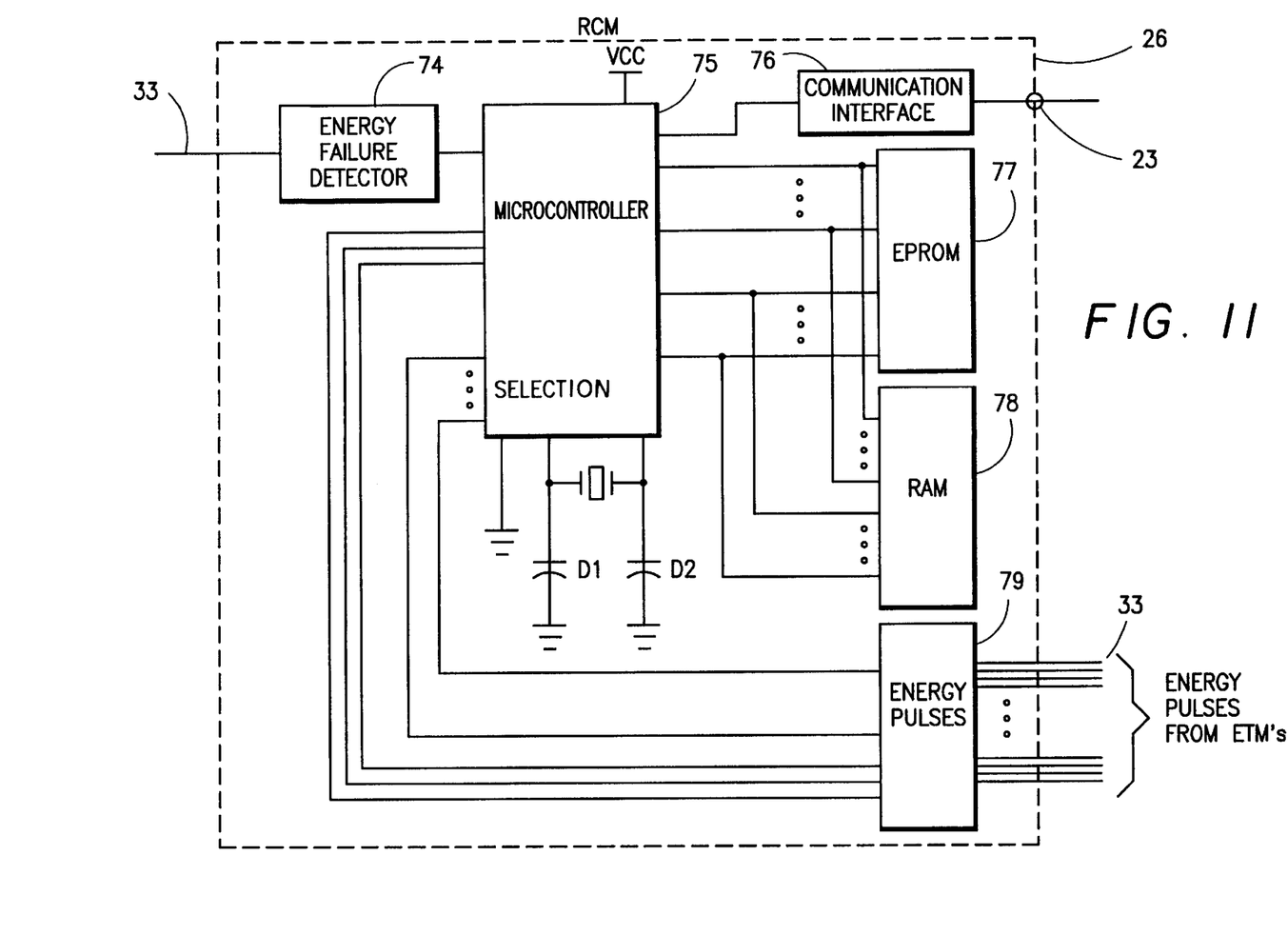
FIG. 11 schematically illustrates a preferred embodiment of the register/concentrator module (RCM) according to the present invention.

The implementation of the RU 24 is shown in more detail in FIG. 10. The central processing unit 63, constituted by a microprocessor, EPROMs and RAMs, is responsible for the collecting of data stored at the MUs 26, through its communication circuit with the MUs 60. This circuit includes a BNC type connector.

The data stored at the RU 24 can be presented to an external user as follows:

1) through a display 62, which is controlled by the central processing unit 63 via the display control circuit 64. The user can visualize the data in an non-automatic manner, through the display 62 using a keyboard and/or control buttons 65 on the RU 24. The keyboard and/or panel buttons control circuit 66 send to the central processing unit 63 instructions referring to the operation desired by the user. The operation instruction specifies the data to be shown at the display 62.

2) through a portable reader/programmer 67, which communicates with the RU 24 via a communication circuit with the reader/programmer 68. The connection 73 can be implemented through an optical or infrared connector. The reader/programmer 67 is an intelligent device, capable of carrying out the automatic collection of all the data stored at the RU 24.

The RU 24 id provided with a clock/calendar circuit 69, which is used for registering the date and time of the last data acquisition successfully carried out.

Finally, the RU 24 is provided with a power supply 71, responsible for the feeding of all the circuits, and an auxiliary supply circuit 70, which is responsible for the the supplying of electric energy only to the central processing unit 63 RAM and to the clock/calendar circuit 69, in the event of an energy failure at the main supply (coming from the electric energy distribution network).

The RU 24 also contains a supply failure detector 72 which, upon electric energy shortage, sends a signal to the central processing unit 63, so that it can take the necessary measures not to loose the stored information.

FIG. 9 illustrates the preferred implementation of the invention with regard to the RCM 26.

The RCM 26 is implemented through a microcontroller 75, EPROMs 77 and non volatile RAM 78, an interface 76 for communication with the RU 24, and a system for multiplexing the energy pulses 79 from the data, signal and power supply bus bar 33. The RCM 26 also contains an energy failure detector 74, which signalizes the possible occurrence of this type of failure to the microcontroller, so that it can take the necessary steps for the consumption data to be saved.

The microcontroller 75 of the RCM 26 collects, in groups of 8, and through the multiplexing system 70, the energy pulses for accounting purposes. The counting of the pulses is stored at the non volatile RAM 78.

The RCM 26, whenever requested by the RU 24, transmits thereto the contents of its non volatile RAM 78, via the communication interface 76.

The complete scope of this invention is determined only by the attached claims.

We claim:

1. Electricity measurement apparatus for measuring electricity supplied as an alternating current to a plurality of separate user lines from a main power inlet line, said electricity measurement apparatus comprising:

voltage sensing means operable for sensing the alternating voltage of the electricity supplied and producing a first alternating signal indicative of said alternating voltage;

a plurality of current sensing means each for sensing the alternating current in a respective different one of said separate user lines and for producing a plurality of second alternating signals each of which is proportional to the current sensed in a respective separate user line by the respective sensing means;

a plurality of calculation means for each respective different one of said current sensing means, each calculation means being arranged to receive said first alternating signal and to receive the second alternating signal from the respective current sensing means and derive therefrom a third signal indicative of power being consumed in the respective separate user line; and means for receiving and registering said third signals.

2. The apparatus of claim 1 for use in a system which has more than one phase in the plurality of separate user lines, wherein the voltage sensing means includes, for each phase:

a conductor forming at least part of one of said separate user lines, a coil through which said conductor passes, and a resistance connected across a respective coil for development across said resistance of voltages providing the second signal received by the calculation means.

3. The apparatus of claim 2, having a plurality of housings, each of the separate user lines passing through a respective housing, each housing containing the current sensing means and the calculation means for the respective user line, the housing providing for said current sensing means and said calculation means a plug connection to a signal, data and power supply bus.

4. The apparatus of claim 2, wherein protective diodes are connected across the coils.

5. The apparatus of claim 4, having a plurality of housings, each of the separate user lines passing through a respective housing, each housing containing the current sensing means and the calculation means for the respective user line, the housing providing for said current sensing means and said calculation means a plug connection to a signal, data and power supply bus.

6. The apparatus of claim 1, wherein the calculation means is operable to provide the third signal in the form of discrete pulses representing energy delivered to the consumer.

7. The apparatus of claim 6 for use in a system which has more than one phase in the plurality of separate user lines, wherein the voltage sensing means includes, for each phase:

a conductor forming at least part of one of said separate user lines, a coil through which said conductor passes, and a resistance connected across a respective coil for development across said resistance of voltages providing the second signal received by the calculation means.

8. The apparatus of claim 7, having a plurality of housings, each of the separate user lines passing through a respective housing, each housing containing the current sensing means and the calculation means for the respective user line, the housing providing for said current sensing means and said calculation means a plug connection to a signal, data and power supply bus.

9. The apparatus of claim 8, wherein protective diodes are connected across the coils.

10. The apparatus of claim 1, wherein said apparatus further includes:

measuring means for measuring the power delivered through the main power inlet line, and detection means for detecting failure or tamper attempts on the basis of the measurement of power delivered from the supply cable and the measurements of power supplied through the plurality of separate user lines.

11. The apparatus of claim 10 for use in a system which has more than one phase in the plurality of separate user lines, wherein the voltage sensing means includes, for each phase:

a conductor forming at least part of one of said separate user lines, a coil through which said conductor passes, and a resistance connected across a respective coil for development across said resistance of voltages providing the second signal received by the calculation means.

12. The apparatus of claim 11, having a plurality of housings, each of the separate user lines passing through a respective housing, each housing containing the current sensing means and the calculation means for the respective user line, the housing providing for said current sensing means and said calculation means a plug connection to a signal, data and power supply bus.

13. The apparatus of claim 12, wherein protective diodes are connected across the coils.

* * * * *